United States Patent
Nair et al.

(10) Patent No.: US 11,189,573 B2
(45) Date of Patent: Nov. 30, 2021

(54) SEMICONDUCTOR PACKAGE WITH ELECTROMAGNETIC INTERFERENCE SHIELDING USING METAL LAYERS AND VIAS

(71) Applicant: Intel Corporation, Santa Clara, CA (US)

(72) Inventors: Vijay K. Nair, Mesa, AZ (US); Digvijay Raorane, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 139 days.

(21) Appl. No.: 16/069,377

(22) PCT Filed: Mar. 31, 2016

(86) PCT No.: PCT/US2016/025335
§ 371 (c)(1),
(2) Date: Jul. 11, 2018

(87) PCT Pub. No.: WO2017/171807
PCT Pub. Date: Oct. 5, 2017

(65) Prior Publication Data
US 2019/0019764 A1    Jan. 17, 2019

(51) Int. Cl.
| H01L 23/552 | (2006.01) |
| H01L 23/00 | (2006.01) |
| H01L 25/065 | (2006.01) |
| H01L 23/48 | (2006.01) |
| H01L 21/78 | (2006.01) |
| H01L 23/498 | (2006.01) |
| H01L 21/82 | (2006.01) |

(52) U.S. Cl.
CPC ............ *H01L 23/552* (2013.01); *H01L 21/78* (2013.01); *H01L 21/82* (2013.01); *H01L 23/48* (2013.01);
(Continued)

(58) Field of Classification Search
None
See application file for complete search history.

(56) References Cited

U.S. PATENT DOCUMENTS

| 7,902,643 B2 * | 3/2011 | Tuttle ............... H01L 21/76898 |
| | | 257/659 |
| 8,237,252 B2 * | 8/2012 | Pagaila ................ H01L 21/561 |
| | | 257/686 |

(Continued)

FOREIGN PATENT DOCUMENTS

KR    10-2011-0029541    3/2011

OTHER PUBLICATIONS

International Search Report and Written Opinion for International Patent Application No. PCT/US2016/025335 dated Nov. 21, 2016, 14 pgs.

(Continued)

*Primary Examiner* — David E Graybill
(74) *Attorney, Agent, or Firm* — Schwabe, Williamson & Wyatt, P.C.

(57) ABSTRACT

A semiconductor package is described herein with electromagnetic shielding using metal layers and vias. In one example, the package includes a silicon substrate having a front side and a back side, the front side including active circuitry and an array of contacts to attach to a substrate, a metallization layer over the back side of the die to shield active circuitry from interference through the back side, and a plurality of through-silicon vias coupled to the back side metallization at one end and to front side lands of the array of lands at the other end to shield active circuitry from interference through the sides of the die.

14 Claims, 7 Drawing Sheets

(52) U.S. Cl.
CPC ........ H01L 23/49827 (2013.01); H01L 24/14 (2013.01); H01L 24/17 (2013.01); H01L 25/0657 (2013.01); H01L 24/13 (2013.01); H01L 24/16 (2013.01); H01L 2224/0401 (2013.01); H01L 2224/06181 (2013.01); H01L 2224/131 (2013.01); H01L 2224/16145 (2013.01); H01L 2224/16146 (2013.01); H01L 2224/16227 (2013.01); H01L 2224/16235 (2013.01); H01L 2224/17181 (2013.01); H01L 2224/94 (2013.01); H01L 2225/06513 (2013.01); H01L 2225/06537 (2013.01); H01L 2225/06541 (2013.01); H01L 2225/06544 (2013.01); H01L 2225/06568 (2013.01); H01L 2924/10253 (2013.01); H01L 2924/1434 (2013.01); H01L 2924/15153 (2013.01); H01L 2924/15311 (2013.01); H01L 2924/3025 (2013.01)

(56) References Cited

U.S. PATENT DOCUMENTS

| | | | | |
|---|---|---|---|---|
| 8,258,012 | B2* | 9/2012 | Pagaila | H01L 23/5389 257/E21.001 |
| 8,319,318 | B2* | 11/2012 | Nalla | H01L 21/568 257/660 |
| 8,357,935 | B2* | 1/2013 | Matsumaru | H01L 21/565 257/48 |
| 8,426,258 | B2* | 4/2013 | Molin | H01L 21/823487 438/138 |
| 8,432,022 | B1* | 4/2013 | Huemoeller | H01L 23/552 257/508 |
| 8,575,769 | B2* | 11/2013 | Pagaila | H01L 21/561 257/706 |
| 8,587,096 | B2* | 11/2013 | Kim | H01L 21/561 257/659 |
| 8,748,245 | B1* | 6/2014 | Stuber | H01L 23/481 438/197 |
| 8,987,872 | B2* | 3/2015 | Hwang | H01L 23/552 257/659 |
| 9,029,201 | B2* | 5/2015 | Nygaard | H01L 21/78 438/122 |
| 9,048,211 | B2* | 6/2015 | Pagaila | H01L 21/561 |
| 9,099,539 | B2* | 8/2015 | Tuttle | H01L 21/76898 |
| 9,111,688 | B2* | 8/2015 | Val | H01L 21/568 |
| 9,391,046 | B2* | 7/2016 | Park | H01L 23/3128 |
| 9,425,156 | B2* | 8/2016 | Jung | H01L 24/13 |
| 9,443,810 | B1* | 9/2016 | Lee | H01L 23/552 |
| 9,443,828 | B2* | 9/2016 | Pagaila | H01L 21/561 |
| 9,466,536 | B2* | 10/2016 | Goktepeli | H01L 23/481 |
| 9,478,507 | B2* | 10/2016 | Stuber | H01L 23/60 |
| 9,570,350 | B2* | 2/2017 | Tuttle | H01L 21/76898 |
| 10,163,744 | B2* | 12/2018 | Kim | H01L 25/0657 |
| 2004/0051170 | A1* | 3/2004 | Kawakami | H01L 21/67092 257/686 |
| 2004/0238934 | A1* | 12/2004 | Warner | H01L 23/24 257/686 |
| 2006/0091517 | A1* | 5/2006 | Yoo | H01L 23/16 257/686 |
| 2008/0054444 | A1* | 3/2008 | Tuttle | H01L 21/76898 257/698 |
| 2008/0265421 | A1* | 10/2008 | Brunnbauer | H01L 21/561 257/758 |
| 2008/0315375 | A1* | 12/2008 | Eichelberger | H01L 21/6835 257/659 |
| 2009/0085185 | A1* | 4/2009 | Byun | H01L 25/105 257/686 |
| 2009/0302435 | A1* | 12/2009 | Pagaila | H01L 21/561 257/659 |
| 2009/0302437 | A1 | 12/2009 | Kim et al. | |
| 2009/0321947 | A1* | 12/2009 | Pratt | H01L 23/481 257/777 |
| 2010/0078776 | A1* | 4/2010 | Barth | H01L 21/76898 257/659 |
| 2010/0214759 | A1 | 8/2010 | Beddingfield et al. | |
| 2010/0244208 | A1* | 9/2010 | Pagaila | H01L 21/568 257/659 |
| 2010/0290191 | A1* | 11/2010 | Lin | H01L 23/49816 361/704 |
| 2011/0012199 | A1* | 1/2011 | Nygaard | H01L 21/84 257/347 |
| 2011/0018114 | A1* | 1/2011 | Pagaila | H01L 21/561 257/686 |
| 2011/0151621 | A1* | 6/2011 | Tuttle | H01L 21/76898 438/107 |
| 2011/0201175 | A1* | 8/2011 | Barth | H01L 23/552 438/454 |
| 2011/0254124 | A1* | 10/2011 | Nalla | H01L 23/552 257/531 |
| 2011/0278703 | A1* | 11/2011 | Pagaila | H01L 23/5389 257/659 |
| 2011/0316156 | A1* | 12/2011 | Pagaila | H01L 21/561 257/738 |
| 2012/0043648 | A1* | 2/2012 | Matsumaru | H01L 21/565 257/618 |
| 2012/0075821 | A1* | 3/2012 | Pagaila | H01L 23/3157 361/783 |
| 2012/0086109 | A1* | 4/2012 | Kim | H01L 21/561 257/659 |
| 2012/0088339 | A1* | 4/2012 | Molin | H01L 21/823487 438/138 |
| 2012/0231620 | A1* | 9/2012 | Kuroda | H01L 21/74 438/586 |
| 2012/0241940 | A1* | 9/2012 | Pagaila | H01L 21/561 257/706 |
| 2012/0273926 | A1* | 11/2012 | Pagaila | H01L 23/552 257/659 |
| 2013/0049215 | A1* | 2/2013 | Larsen | H01L 23/485 257/774 |
| 2013/0052776 | A1 | 2/2013 | Nalla et al. | |
| 2014/0001627 | A1* | 1/2014 | Pagaila | H01L 21/561 257/706 |
| 2014/0264784 | A1* | 9/2014 | Ho | H01L 23/552 257/659 |
| 2014/0291820 | A1 | 10/2014 | Pagaila | |
| 2014/0291860 | A1* | 10/2014 | Stuber | H01L 23/481 257/774 |
| 2014/0327077 | A1* | 11/2014 | Stuber | H01L 23/481 257/347 |
| 2014/0342529 | A1* | 11/2014 | Goktepeli | H01L 23/481 438/458 |
| 2015/0001689 | A1* | 1/2015 | Goetz | H01L 23/552 257/659 |
| 2015/0028477 | A1* | 1/2015 | Jung | H01L 24/13 257/738 |
| 2015/0137307 | A1* | 5/2015 | Stuber | H01L 23/60 257/503 |
| 2015/0228628 | A1* | 8/2015 | Pagaila | H01L 21/561 257/698 |
| 2015/0303110 | A1* | 10/2015 | Tuttle | H01L 21/76898 438/637 |
| 2016/0253585 | A1* | 9/2016 | Wei | G06K 19/0776 235/488 |
| 2017/0062357 | A1* | 3/2017 | Kamgaing | H01L 25/0657 |
| 2019/0019764 | A1* | 1/2019 | Nair | H01L 21/82 |

OTHER PUBLICATIONS

International Preliminary Report on Patentability for International Patent Application No. PCT/US2016/025335, dated Oct. 11, 2018, 10 pages.

* cited by examiner

SEMICONDUCTOR PACKAGE WITH ELECTROMAGNETIC INTERFERENCE SHIELDING USING METAL LAYERS AND VIAS

CROSS-REFERENCE TO RELATED APPLICATION

This patent application is a U.S. National Phase Application under 35 U.S.C. § 371 of International Application No. PCT/US2016/025335, filed Mar. 31, 2016, entitled "SEMICONDUCTOR PACKAGE WITH ELECTROMAGNETIC INTERFERENCE SHIELDING USING METAL LAYERS AND VIAS," which designates the United States of America, the entire disclosure of which is hereby incorporated by reference in its entirety and for all purposes.

FIELD

The present description relates to semiconductor packages and in particular to interference shielding incorporated into or on the package.

BACKGROUND

Electromagnetic interference (EMI) can affect the operation of electronic circuitry and especially analog and radio frequency circuitry. As the carrier frequencies for wireless data increase they come closer to the operations of integrated circuits. This is a serious issue in mobile devices, such as tablets, computers and smart phones. EMI is generated within such devices and also from other nearby devices including nearby tablets, computers, and smart phones.

While EMI exists across the entire electromagnetic spectrum, from direct current electricity and frequencies less than 1 Hz to gamma rays above 1020 Hz, the great majority of EMI problems are limited to that part of the spectrum with frequencies between 25 kHz and 10 GHz. This portion is known as the radio frequency interference (RFI) area and covers radio and audio frequencies. The acronym EMI is generally used to represent both EMI and RFI. Radio frequency interference (RFI) is also described as any undesirable electrical energy with content within the frequency range dedicated to radio frequency transmission. Radiated RFI is most often found in the frequency range from 30 MHz to 10 GHz. The interference may be transient, continuous or intermittent.

External sources of EMI include communication and radar transmitters, electric switch contacts, computers, voltage regulators, pulse generators, arc/vapor lamps, intermittent electrical ground connections, solar noise, lightening electromagnetic pulses. EMI affects the ability of high-performance electronic devices to maintain signal integrity in the time domain and to maintain power integrity in the frequency domain. For integrated circuits, the RFI frequencies are the most harmful. The electromagnetic radiation generated by one electronic RF device may negatively affect other, similar, electronic devices such as cell phones, radios, etc. When a cell phone is ON, for example, a great deal of power is transmitted. The transmitted power interferes with other devices.

EMI/RFI Shielding is used in many telecommunication devices because radio transmissions can hamper the reception of a signal if the signals RFI and the signal are near the same frequency. In addition, strong magnetic and electrical fields can affect currents and even generate currents in integrated circuits. EMI/RFI Shielding may prevent incorrect frequencies from interfering with a device. In a medical hospital, for example, equipment is shielded to allow it to meet governmental standards against being affected by cell phones, PDA's, (Personal Digital Assistants) or other electronic devices.

As the sizes of system boards, integrated circuit packages, radio dies and power supplies continue to decrease, the power density has increased and power consumption is reduced. These smaller, lower power components are even more sensitive to EMI. As a result, shielding becomes more important.

BRIEF DESCRIPTION OF THE DRAWINGS

Embodiments are illustrated by way of example, and not by way of limitation, in the figures of the accompanying drawings in which like reference numerals refer to similar elements.

DETAILED DESCRIPTION

EMI/RFI shielding can greatly increase size, cost and bulk in a semiconductor package. As described herein, a shield may be formed while making a die as a part of other processes. This reduces additional steps that otherwise would be required. As described herein a flip chip may include a shield as part of the die. In the case of a WLCSP (Wafer Level Chip Scale Package) and many other types of packages, TSVs (Through Silicon Vias) may be used to form a shield. This may avoid a need for an additional external shield. Instead the EMI shield is built within the package and is integral to it.

The processes used to form the shield are all mature processes such as plating so that the implementation may be formed accurately and reliably. Existing packaging techniques such as flip chip packaging may also be used.

Figure 1:
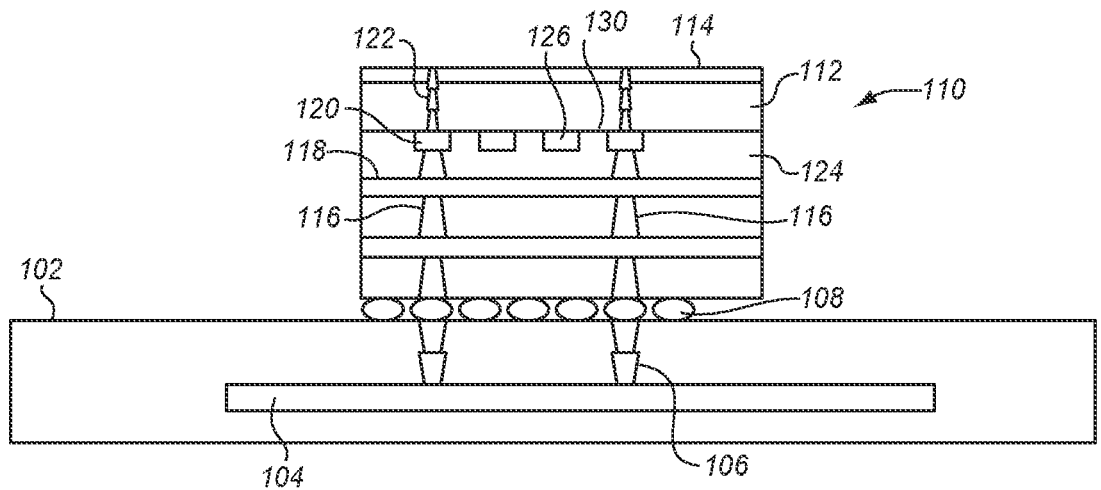
FIG. 1 is a cross-sectional side view diagram of a shielded die on a package substrate according to an embodiment.

FIG. 1 is a side cross-sectional view diagram of a WLCSP (Wafer Level Chip Scale Package) mounted to a substrate incorporating an internal EMI/RFI shield. While a WLCSP is shown, the internal shield approach may be applied to many different types of chips or dies. The chip 110 is mounted to a package substrate 102 or any other substrate, depending on the implementation. In some embodiments the package substrate is mounted to a motherboard or system board, or mounted to a socket that is mounted to a motherboard. In other embodiments, the chip is mounted directly to the motherboard, such as with direct chip attach, for example. In this example, the chip is mounted directly to a package substrate, but it may be mounted to an interposer, or additional substrate or chip that is mounted to the substrate. Surface mount technology (SMT) may be used or any other suitable chip attachment technology. The substrate 102 has a ground plane 104 that is connected to the surface of the board using vias 106. The substrate may have many other wiring layers (not shown) for power, data, and control at the same and at other levels of the substrate. The vias connect to the chip through a solder bump, solder pad, land grid, ball grid, or other type of electrical connection array 108.

The chip has an active circuit area 130 formed on a thinned silicon substrate 112. The substrate may or may not be thinned. The back side of the substrate is covered in a metal layer 114, sometimes referred to as back side metallization. Through-silicon vias (TSVs) 122 connect the back side metallization to pads 120 on the front side of the substrate. The front side of the substrate has multiple connectors or pads for power, data, and control. The front side pads and connectors are covered in a first dielectric build-up layer. A metal redistribution layer 118 is applied over the first dielectric layer 124. Additional dielectric and redistribution layers are formed over the first two layers to suit the particular design for the chip and its intended use.

The metal lines may be formed Cu or Al or any other suitable conducting metal by plating or by printing. The dielectric layers may be formed of epoxy, build up material or film with or without fillers. The substrate may be made with or without a core. The core may be SVLC (Stacked Via Laminate Core) for example and may be formed of a pre-impregnated or low CTE (Coefficient of Thermal Expansion) polymer filled with glass fibers. The approaches described herein may be applied to flip chip, WLCSP, PoINT (Patch on Interposer) style packages, among others.

Additional vias 116 extend from the front side of the die to the solder ball array 108 to connect the front side pads of the die to the system board. These include a set of vias 116 to connect the back side metallization to the ground plane of the system board through the solder ball array 108 and the vias 106 through the system board. The illustrated structure allows for a metal connection through the silicon substrate 112, through the buildup layers 124 and through the solder ball array 108 directly to the ground plane. The quality of the connection in each via may be independently checked electrically to ensure an effective connection.

The grounded back side metal layer 114 provides an effective shield to prevent EMI and RFI from affecting the circuitry and the data and control vias in the die. It also prevents any EMI or RFI generated in the die from leaving through the back side and affecting other components that may also be attached to the system board or in another nearby location. The back side metal layer does not provide any protection from interference that may come through the sides of the die around the back side layer. The TSVs 122 and connecting vias 116 through the buildup layers provide this protection and are collective referred to as side vias for the protection that they provide to the sides of the die.

As shown, the side vias are outside of the connection pads 126 on the die for the active circuitry. These pads connect power, data, and control into the active circuitry of the die to allow the die to perform its intended function, such as general computations, parallel graphics processing, signal processing, or storage. The side vias are vertically stacked and aligned to form vertical conductive lines from the system board to the back side metal layer that surround the active circuitry and that also surround the vias (not shown) which connect this circuitry to the solder ball array 108. The side vias are separated by a gap that is selected based on the frequencies that are to be blocked. In this way the vias form a wall that is like a side of a Faraday cage.

Figure 2:
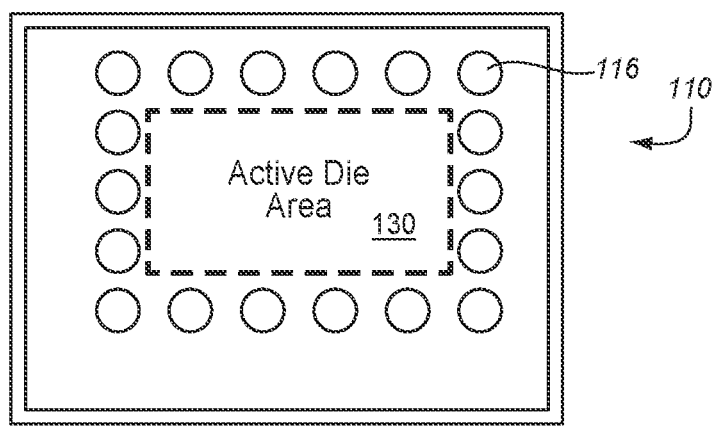
FIG. 2 is cross-sectional top view diagram of the shielded die of FIG. 1 according to an embodiment.

While only two vias are visible in the cross-sectional view of FIG. 1, FIG. 2 is a diagram of via placement as a cross-sectional top view diagram of the die of FIG. 1. As shown there is an array of vias 116 placed at distances across the perimeter of the active circuitry 130 of the die 110. The number of vias may be selected to provide sufficient conductivity for the expected amount of EMI shielding. The pattern of spacing and positioning of the vias may be adapted to suit the size of the chip and frequencies and amplitudes that are to be shielded. In order to provide a shielding effectiveness greater than about 40 dB a Faraday cage created by the vias shown and described herein may be combined with additional external shielding. To shield EMI having frequencies in a 1-20 GHz range, a via spacing of 300 µm to 100 µm may be used to provide shielding effectiveness of 40 dB or better. The higher the frequency, the smaller the via spacing. A via spacing of 20 µm to 10 µm may be easily fabricated using current WLCSP and other similar types of processes.

Figure 3:
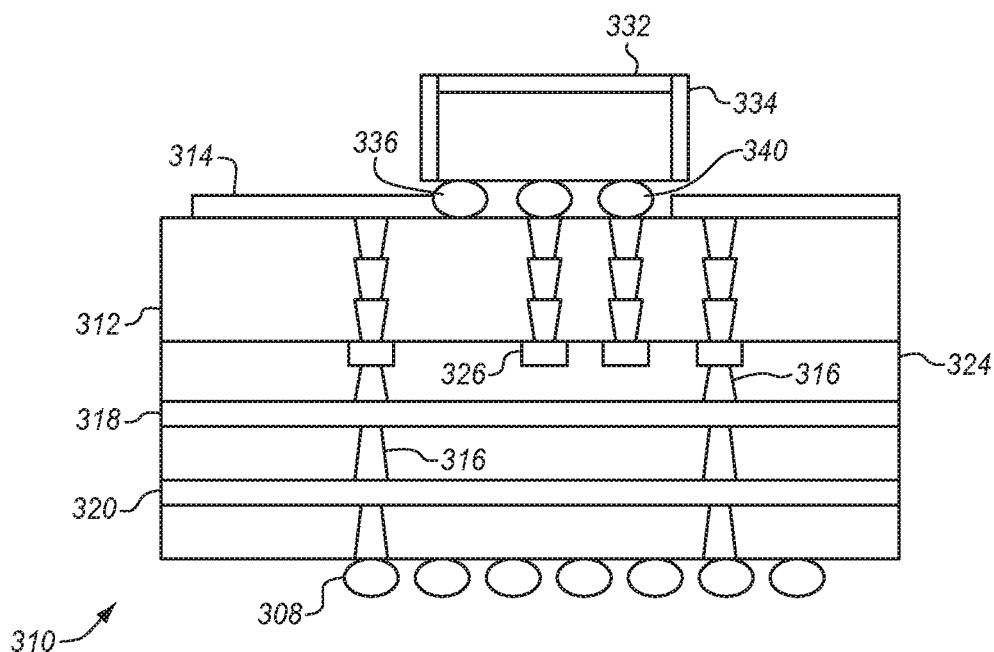
FIG. 3 is a cross-sectional side view diagram of stacked shielded dies according to an embodiment.

FIG. 3 is a side cross-sectional view diagram of stacked dies with a back side EMI/RFI shield. The bottom chip 310 is similar to the chip of FIG. 1 and a second chip 332 is stacked over the bottom chip. This stacked configuration is particularly well-suited to a memory chip stacked over a processor because the two chips may use different fabrication technologies and the same processor may be packaged with different sizes or types of memory chips. However, this stacked configuration may be used for many other combinations such as general and graphics processing, baseband and radio frequency signal processing, image and video processing, etc. While only one upper die is shown, there may be more than one upper die, depending on the relative sizes of the dies.

The lower primary chip has a silicon substrate 312 with active circuitry formed on the front side and a set of connection pads 326 to connect the front side to power, data, and control signals in a system board, interposer, socket, carrier or other structures. Metal redistribution layers 318, 320 separated by layers of dielectric 324 are formed over the front side contacts. The front side contacts 326 are connected through the front side dielectric through vias (not shown) to a solder ball array 308 or other type connector. These connectors are then attached to a system board or other suitable structure.

As in the example of FIG. 1, a back side metal layer 314 forms a shield over the back of the lower main or primary die or chip 310. The back side metal layer is connected through vias 316 that are vertically stacked through the front side layers to the connection array 308 to connect to an external ground plane. These side vias form a shield to protect the sides of the die from external interference or to protect external dies from interference generate by this die 310.

A secondary chip 332 is attached over the back side of the primary chip 310 using a second solder ball array 336, land grid array, pad or land array, or any other suitable electrical connection on the back side of the primary die. As shown, these are connected to the primary die using TSVs 342 through the primary die. The secondary die may connect to circuitry of the primary die through the TSVs 322 or connect through the TSVs 322 in the primary die and vias (not shown) in the front side layers to the system board (e.g. 102), or both depending on the nature of the die and the type of system.

To accommodate the back side connections on the primary die there is an opening 340 formed in the back side metal layer. Connection pads are formed on the back side of the die where the metal layer is removed in order to connect with the secondary die. In this example there is a solder ball array 336 in the opening to provide electrical connections for power, data, and control. The secondary die has metal layers over the top of the die and on all four sides to provide shielding from interference of any kind. The top of the die may be the front side or the back side, depending on the configuration of the secondary die.

The shielding 334 on the side of the secondary die between the front and back sides is connected to the back side metal layer of the primary die. Through this metal layer, the secondary die is coupled to the ground plane of the system board. The connection to ground may be through a direct connection between the metal layers or with added wire bonds, or any other suitable approach.

The second silicon die may take any of a variety of different forms. In some embodiments, the second die has a front side and a back side. The front side includes active circuitry and an array of lands to attach to the back side of the first die. A second metal layer is over the back side of the second die. The first die has pads on the back side to connect to the second die and to TSV in the second die to connect to the back side pads of the first die.

While the top die has a back side metallization and side wall metallization, vias may be used instead. The top die 332 may be formed in the same way as the bottom or primary die 310 with a metal layer on the top and vertical vias through the die around the active circuitry. These vias may be connected to the back side metallization of the primary die. The vertical vias of the secondary die in this case function in the same way as the side vias of the primary die to shield the active circuitry of the secondary die from external EMI or to shield other dies from EMI generated by the top die.

Figure 4:
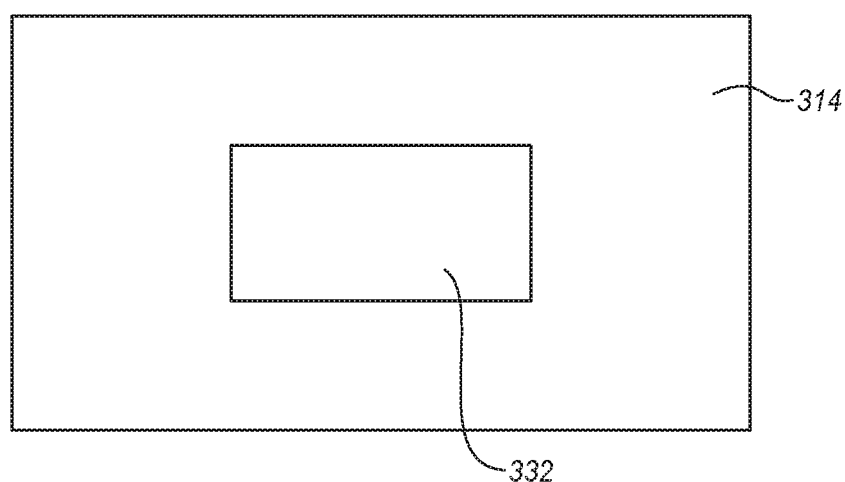
FIG. 4 is a top plan view diagram of the stacked dies of FIG. 3 according to an embodiment.

FIG. 4 is a top plane view of the stack of FIG. 3. In this example, the back side metal layer 314 of the primary die has a central opening to which the secondary die is attached. The top metal layer 332 of the second die is shown as placed in this central opening. While the secondary die is shown as having the same proportions of length and width as the primary die and mounted in the center of the primary die, the invention is not so limited. The secondary die may have any other shapes and be offset in any desired direction. As mentioned above there may be multiple dies stacked over the primary die in different positions over the die.

While FIG. 1 shows a die mounted to a large flat substrate surface, the die may also be mounted in a cavity. In some embodiments a cavity is formed in a motherboard or other substrate by laser ablation or some other process. A connection array similar to that shown in FIG. 1 is then formed in the bottom floor of the cavity. The die or stacked dies are then mounted in this cavity using e.g. surface mount technology. The back side metallization may be connected to a ground plane in the motherboard through the connection array in the cavity. The cavity allows the total height of the system to be reduced since the bottoms of the dies are lowered below the top surface of the board or substrate.

Figure 5:
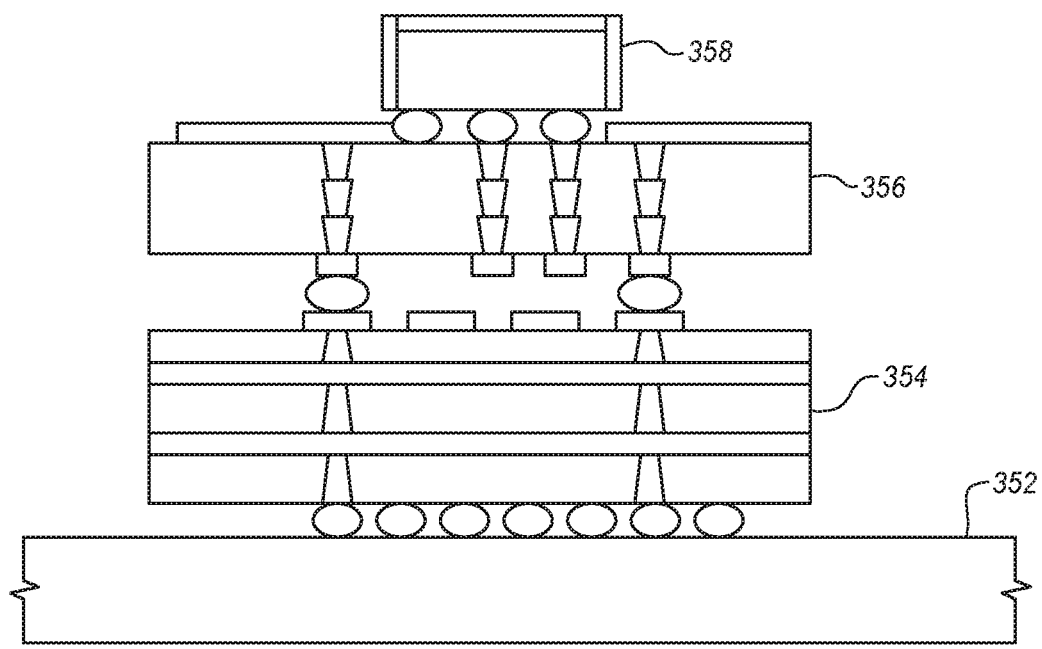
FIG. 5 is a cross-sectional side view diagram of stacked dies in a flip chip configuration according to an embodiment.

FIG. 5 is a cross-sectional side view diagram of stacked dies in a flip chip configuration as compared to the WLCSP configuration shown above. Any of the examples may be modified to suit one or the other of the two configurations or any other similar die types, structures, and configurations. In addition, a flip chip type die may be stacked over a WLCSP type die and vice versa.

In the illustrated example, there is a mother board, system board, interposer, or socket substrate 352 with a connection array. A package substrate 354 is soldered or clamped to the connection array of the board. The substrate may be of any of the forms mentioned above including with or without a core. A flip chip type die 356 is mounted to the package substrate 354 using a suitable connection array. The flip chip die has a back side metallization layer on the side of the die opposite the substrate. An array of TSVs surround the active circuitry in an arrangement such as that shown in FIG. 2. The TSVs and back side metal layer provide the EMI shield as discussed above.

Another die 358 with its own EMI shielding may optionally be mounted over the primary die 356 in the same manner as described above with respect to FIG. 3. This die may use TSVs like the primary die or metal layers on the sides of the die. In any case, the metal layer on the top of the secondary die and the side vias or metal layers are connected to the ground layer of the substrate through the primary die.

Figure 6:
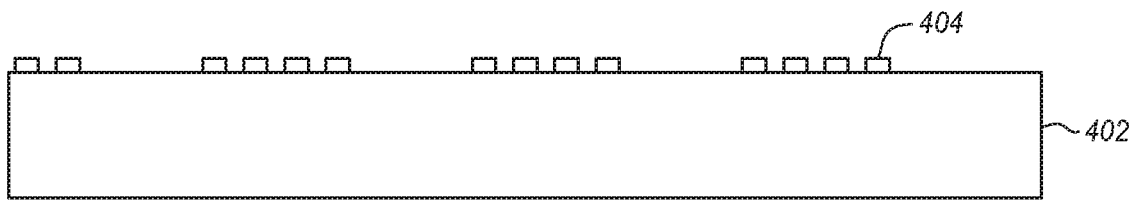
FIGS. 6-15 are cross-sectional side view diagrams of fabrication stages for producing a WLCSP with an EMI shield according to an embodiment.

FIGS. 6-15 show fabrication stages for producing a WLCSP with an EMI shield as shown in FIGS. 1 and 3. A flip chip and other types of dies may be fabricated in similar ways with suitable adaptations. The WLCSP produced in this way has an EMI shield embedded in the die as well as back side metallization. FIG. 6 is a cross-sectional side view diagram that shows a portion of a silicon substrate 402 in the form of a wafer. Multiple chips or dies will be formed from this single wafer. Circuitry has been formed on the front side of the substrate using any desired technique such as be photolithography, etching, and depositing. There are multiple connections pads or lands 404 formed over the circuitry to connect the circuitry to external components.

Figure 7:
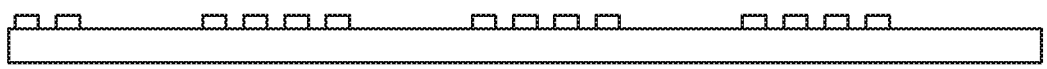

FIG. 7 is a cross-sectional side view diagram of the wafer of FIG. 6 after thinning. The wafer is mounted on a back grinding film and the back side of the wafer is thinned to reduce the overall size of the die after the circuitry has been formed.

Figure 8:
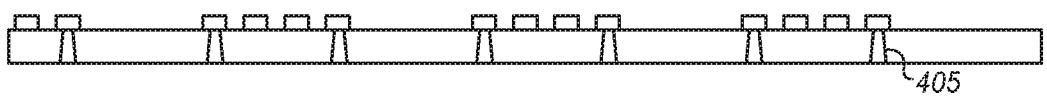

FIG. 8 is a cross-sectional side view diagram of the wafer of FIG. 7 after through silicon vias 405 have been formed through the back side of the wafer. These may be formed by etching, drilling or another suitable technique and are then filled with a suitable conductor such as copper or aluminum. These vias 405 provide an electrical connection to the back side metal layer of FIG. 9 and also connect to the top side vias to connect the back side metal to a ground plane of a substrate. These vias 405 also form part of the side via EMI shield as described above.

Figure 9:

FIG. 9 is a cross-sectional side view diagram of the wafer of FIG. 8 after a back side metalation layer 406 has been added to the wafer. The back side of the wafer may be plated to form this layer. This back side plated layer forms a part of the EMI shield and is electrically connected to the TSVs 405.

Figure 10:
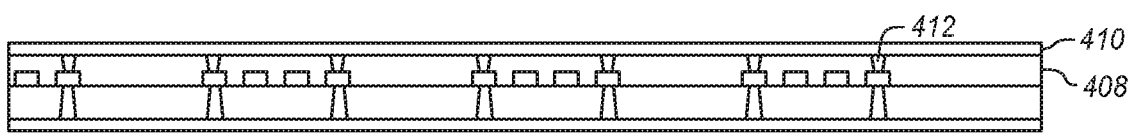

FIG. 10 is a cross-sectional side view diagram of the wafer of FIG. 9 after a dielectric buildup layer 408 has been deposited over the front side of the die and over the circuitry layers. In addition, vias 412 have been formed and filled through the dielectric, and a metal redistribution layer 410 is formed over the dielectric layer. The buildup layers are built as part of the WLCSP package at the wafer layer. The outer stacked vias 412 connect all of the ground planes and connect the ground planes to the back side metal of the die. The outer vias form a ground connection for the back side metallization 406 and also are part of the EMI shield. The inner vias form power, data, and control connections to the die.

Figure 11:
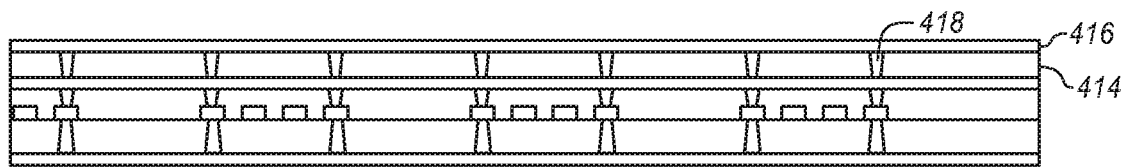

FIG. 11 is a cross-sectional side view diagram of the wafer after additional dielectric and metal layers have been formed to further build up the package. An additional dielectric layer 414 is formed over the last front side redistribution layer 410. Vias 418 are stacked over the prior vias 412 to connect through to the back side metal layer 406. An additional metal layer 416 is plated over the second dielectric layer 414.

Figure 12:
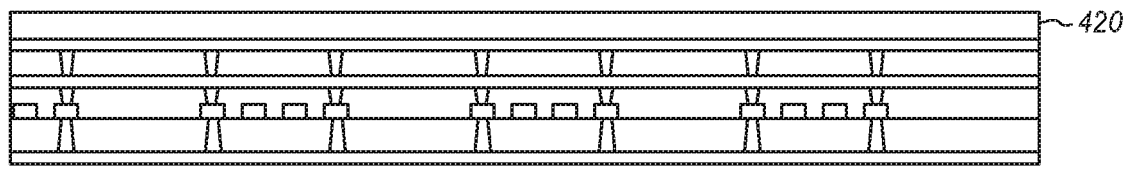
Figure 13:
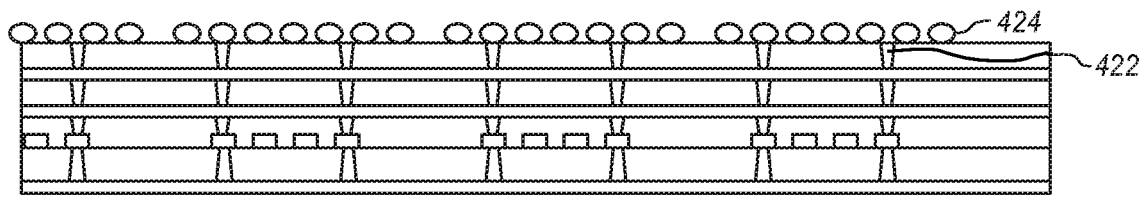

FIG. 12 is a side cross-sectional side view diagram of the wafer of FIG. 11 with another dielectric buildup layer 420 deposited over the last metal layer 416. FIG. 13 is a cross-sectional side view diagram of the wafer of FIG. 12 with an additional stack of vias 422 over the previous vias 412, 418 to connect to an array of metal connections 424, such as lands, pads, solder balls or another electrical connector. In the illustrated example, this completes the front side layers of the wafer. The last layer of vias 422 connect the last redistribution layer 416 to the solder ball array 424.

In other embodiments, there may be more or fewer dielectric and metal layers. The metal layers may be patterned to provide redistribution and pitch translation of the die contacts to the solder balls 424 on the front side of the package. In this example, solder balls are provided for a surface mount connection. In other embodiments other types of physical and electrical connection may be used.

Figure 14:
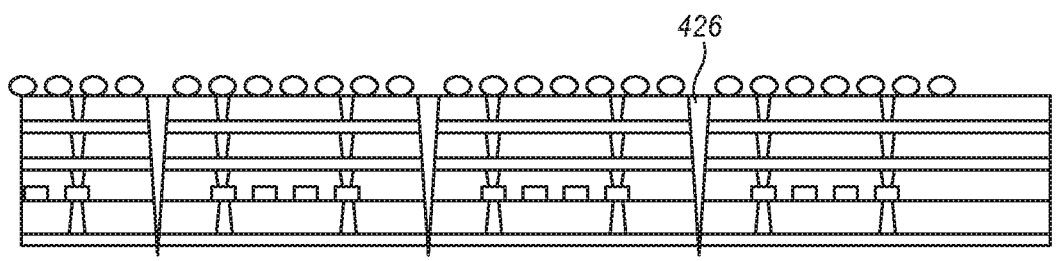
Figure 15:
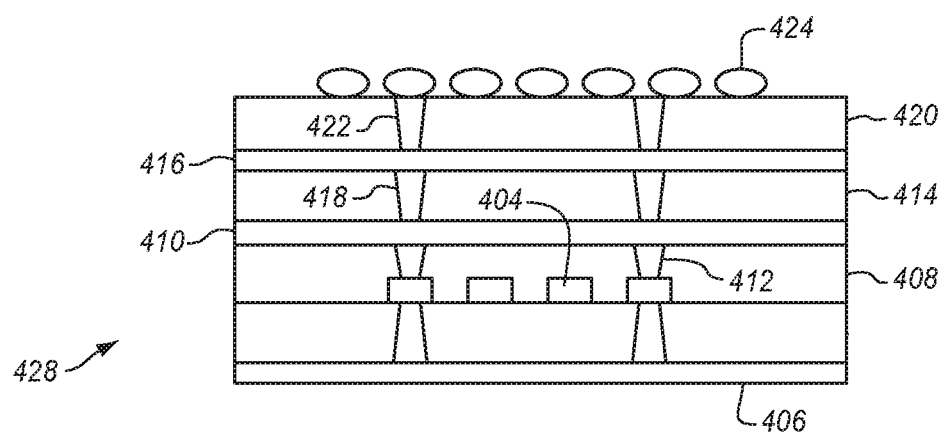

FIG. 14 shows saw kerfs 426 through the wafer substrate 402 and the metal and dielectric layers to singulate the wafer into individual dies 428. The singulated die 428 is shown in FIG. 15 and is similar to the die shown in FIG. 1. The final die has many vertical stacks of the vias 412, 418, 422 to form a shield around the active circuitry 404 and the data or signal lines through the dielectric. These side vias are made at the same time as the standard vias that connect to power, data, and control signals through the front side layers 408, 410, 414, 416, 420. As a result they can be made with no additional steps and almost no additional cost. FIG. 15 shows the final singulated die with an optionally thinned back side silicon substrate and a metal shield. The back side metal is augmented with side vias to provide complete EMI and RFI protection.

The approaches described herein are particularly suitable for adding shielding to any FC (Flip Chip) package, WLCSP or similar type of package. This allows sensitive devices within the package or outside of the package to be protected. As described herein, an EMI cage is formed using stacked via and ground planes in a WLCSP or similar package. TSV vias connect a back side metallization layer to grounded planes in a FC or WLSCP substrate.

EMI shielding as described herein may be useful in embedded die architectures in communication and similar types of devices for which EMI is a major concern. Different chips may be mounted closer to one another because the EMI imposed by one chip on another would be lower. When done thoroughly, no additional shielding or Faraday's cage may be required.

The back side metallization 114, 332, 406 may be plated to the back side of the die using metal particles dispersed in organic or aqueous liquids. Such coatings may also be applied using spray painting. In some embodiments, a thick coating of more than 25 μm thick may be used with the metal particles that are on the orders of a few nm thick.

For a reduced z-height for the package, a thinner coating, such as an electroless coating may be used. Various metals such as Ag, Cu. Au, Al, Zn, Ni, or Sn may be used as a shielding material. Various combinations of metal layers may also be used, for example 250 nm of Ni over 1000 nm of Cu. The specific combination and thicknesses of layers may be selected based on the expected amplitude and frequencies of interference that is to be shielded.

In order to provide a shielding effectiveness greater than about 40 dB the metallization and via systems described herein may be combined with additional external shielding or more complex multiple layer coatings may be used. Depending on the implementation even very thin electroless coatings may be sufficient for the desired EMI shielding.

Figure 16:
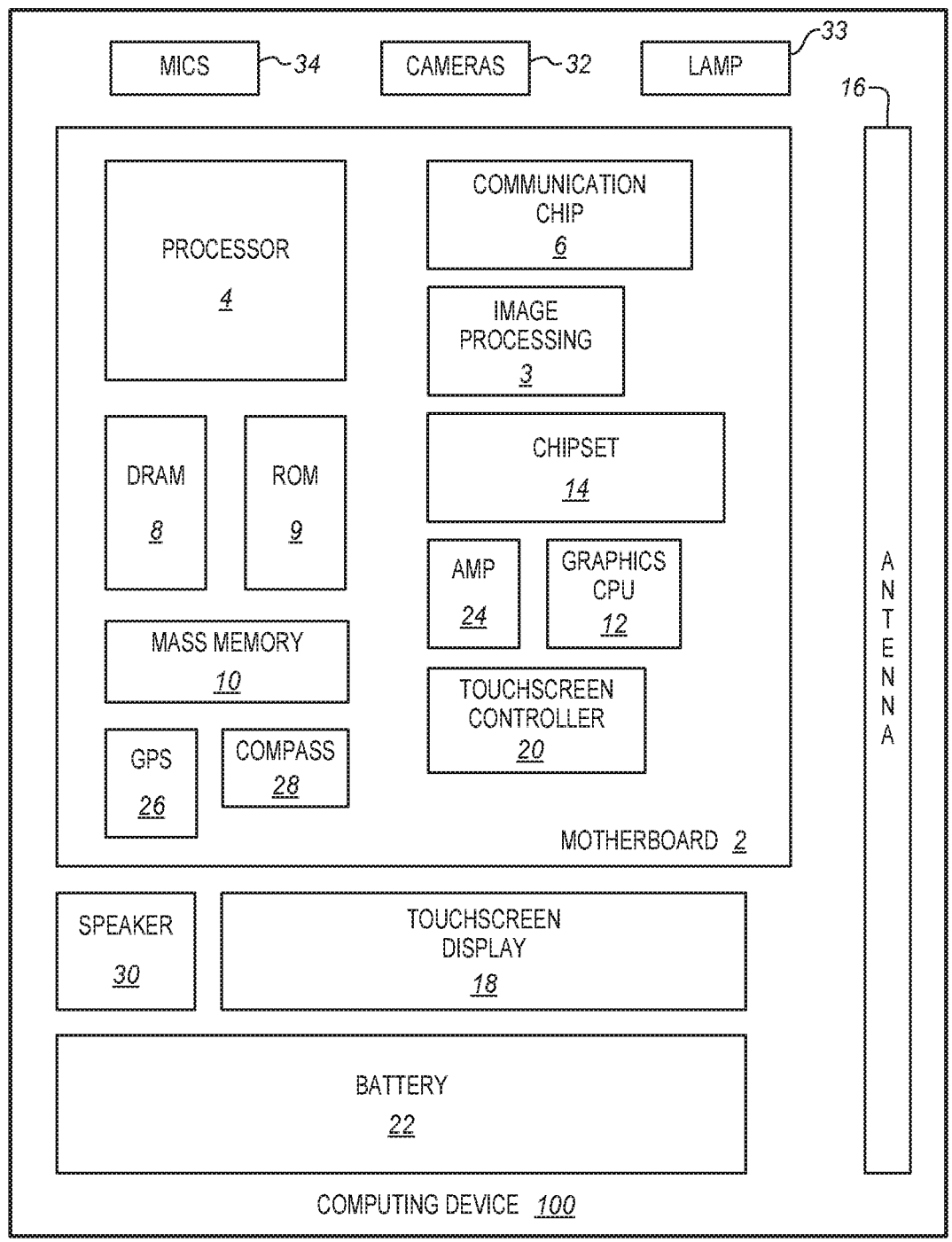
FIG. 16 is a block diagram of a computing device suitable for use with embodiments.

FIG. 16 illustrates a computing device 100 in accordance with one implementation of the invention. The computing device 100 houses a board 2. The board 2 may include a number of components, including but not limited to a processor 4 and at least one communication chip 6. The processor 4 is physically and electrically coupled to the board 2. In some implementations the at least one communication chip 6 is also physically and electrically coupled to the board 2. In further implementations, the communication chip 6 is part of the processor 4.

Depending on its applications, computing device 100 may include other components that may or may not be physically and electrically coupled to the board 2. These other components include, but are not limited to, volatile memory (e.g., DRAM) 8, non-volatile memory (e.g., ROM) 9, flash memory (not shown), a graphics processor 12, a digital signal processor (not shown), a crypto processor (not shown), a chipset 14, an antenna 16, a display 18 such as a touchscreen display, a touchscreen controller 20, a haptic actuator array 21, a battery 22, an audio codec (not shown), a video codec (not shown), a power amplifier 24, a global positioning system (GPS) device 26, a compass 28, an accelerometer (not shown), a gyroscope (not shown), a speaker 30, a camera 32, and a mass storage device (such as hard disk drive) 10, compact disk (CD) (not shown), digital versatile disk (DVD) (not shown), and so forth). These components may be connected to the system board 2, mounted to the system board, or combined with any of the other components.

The communication chip 6 enables wireless and/or wired communications for the transfer of data to and from the computing device 100. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 6 may implement any of a number of wireless or wired standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, Ethernet derivatives thereof, as well as any other wireless and wired protocols that are designated as 3G, 4G, 5G, and beyond. The computing device 100 may include a plurality of communication chips 6. For instance, a first communication chip 6 may be dedicated to shorter range wireless communications such as Wi-Fi and Bluetooth and a second communication chip 6 may be dedicated to longer range wireless communications such as GPS, EDGE, GPRS, CDMA, WiMAX, LTE, Ev-DO, and others.

The processor 4 of the computing device 100 includes an integrated circuit die packaged within the processor 4. In some implementations of the invention, the packages that include the processor, memory devices, communication devices, or other components may include interference shielding and connections as described herein, if desired. The term "processor" may refer to any device or portion of a device that processes electronic data from registers and/or memory to transform that electronic data into other electronic data that may be stored in registers and/or memory.

In various implementations, the computing device 100 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, a digital video recorder, wearables, and drones. In further implementations, the computing device 100 may be any other electronic device that processes data.

Embodiments may be adapted to be used with a variety of different types of packages for different implementations. References to "one embodiment", "an embodiment", "example embodiment", "various embodiments", etc., indicate that the embodiment(s) of the invention so described may include particular features, structures, or characteristics, but not every embodiment necessarily includes the particular features, structures, or characteristics. Further, some embodiments may have some, all, or none of the features described for other embodiments.

In the following description and claims, the term "coupled" along with its derivatives, may be used. "Coupled" is used to indicate that two or more elements co-operate or interact with each other, but they may or may not have intervening physical or electrical components between them.

As used in the claims, unless otherwise specified, the use of the ordinal adjectives "first", "second", "third", etc., to describe a common element, merely indicate that different instances of like elements are being referred to, and are not intended to imply that the elements so described must be in a given sequence, either temporally, spatially, in ranking, or in any other manner.

The drawings and the forgoing description give examples of embodiments. Those skilled in the art will appreciate that one or more of the described elements may well be combined into a single functional element. Alternatively, certain elements may be split into multiple functional elements. Elements from one embodiment may be added to another embodiment. For example, the specific location of elements as shown and described herein may be changed and are not limited to what is shown. Moreover, the actions of any flow diagram need not be implemented in the order shown; nor do all of the acts necessarily need to be performed. Also, those acts that are not dependent on other acts may be performed in parallel with the other acts. The scope of embodiments is by no means limited by these specific examples. Numerous variations, whether explicitly given in the specification or not, such as differences in structure, dimension, and use of material, are possible. The scope of embodiments is at least as broad as given by the following claims.

The following examples pertain to further embodiments. The various features of the different embodiments may be variously combined with some features included and others excluded to suit a variety of different applications. Some embodiments pertain to an apparatus that includes a silicon substrate having a front side and a back side, the front side including active circuitry and an array of contacts to attach to a substrate, a metallization layer over the back side of the die to shield active circuitry from interference through the back side; and a plurality of through-silicon vias coupled to the back side metallization at one end and to contacts of the array of contacts at the other end to shield active circuitry from interference through the sides of the die.

Further embodiments include metal layers and dielectric layers over the active circuitry and the front side contacts, the metal layers being separated from each other by the dielectric layers, a solder ball array over an outer dielectric layer to contact the substrate, and a plurality of side vias to connect the through silicon vias through the metal and dielectric layers to the solder ball array.

Further embodiments include the substrate, wherein the substrate is a printed circuit board (PCB) and wherein the solder ball array is attached to the PCB by surface mount technology.

In further embodiments the side vias are spaced from each at a distance smaller than an anticipated wavelength of electromagnetic interference.

In further embodiments the side vias are outside the active circuitry to shield the active circuitry from outside electromagnetic interference.

In further embodiments the back side metal layer is a plated copper layer.

In further embodiments the silicon substrate is thinned before the back side metallization layer is applied.

In further embodiments the through-silicon vias are etched through the silicon substrate and filled with copper.

Further embodiments include a second silicon die over the silicon substrate, the second silicon die to attach to the back side of the silicon substrate, and a second metal layer over the second silicon die, the second metal layer being coupled to the first metal layer.

In further embodiments the second silicon die is mounted within an opening in the back side metallization layer.

In further embodiments the second silicon die has metal layers on sides of the die electrically coupled to the second metal layer and to the first metal layer and wherein the second metal layer is coupled to the first metal layer through the side metal layers.

Some embodiments pertain to a method that includes forming active circuitry and an array of contacts to attach to a substrate on a front side of a silicon substrate, forming a plurality of through-silicon vias from a back side of the silicon substrate to contacts of the front side array of contacts shield the active circuitry from interference through the sides of the die, and applying a metal layer over the back side of the silicon substrate and over the through silicon vias to shield the active circuitry from interference through the back side of the silicon substrate, wherein the back side metal layer is grounded through the through-silicon vias.

Further embodiments include forming metal layers and dielectric layers over the active circuitry and the front side contacts, the metal layers being separated from each other by the dielectric layers, and forming a plurality of side vias through the metal and dielectric layers to connect to the through silicon vias, and applying a solder ball array over an outer dielectric layer to connect the side vias to an external ground plane.

Further embodiments include singulating the silicon substrate to form a plurality of dies and attaching at least one die to a printed circuit board (PCB) wherein the solder ball array is attached to the PCB by surface mount technology.

Further embodiments include forming data vias through the metal and dielectric layers to connect to the active circuitry during forming the plurality of side vias.

In further embodiments applying a metal layer comprises plating metal particles dispersed in organic liquids over the back side of the silicon substrate.

In further embodiments the metal layer comprises a first electroless nickel over a second electroless copper layer.

Some embodiments pertain to a computing system that includes a printed circuit board, a memory attached to the printed circuit board, and a package attached to the printed circuit board, the package having a silicon substrate having a front side and a back side, the front side including active circuitry and an array of contacts to attach to a substrate, a metallization layer over the back side of the die to shield active circuitry from interference through the back side, and a plurality of through-silicon vias coupled to the back side metallization at one end and to contacts of the array of contacts at the other end to shield active circuitry from interference through the sides of the die.

In further embodiments the printed circuit board comprises a ground plane and wherein the metallization layer is coupled to the ground plane through the through-silicon via.

In further embodiments the through-silicon vias are spaced apart to form a Faraday cage around the active circuitry.

The invention claimed is:

1. An apparatus comprising:
    a silicon substrate having a front side and a back side, the front side including active circuit area and an array of contacts to attach to a substrate, and the active circuit area having a perimeter;
    a metallization layer over the back side of the silicon substrate to shield the active circuit area from interference through the back side;
    a plurality of through-silicon vias coupled to the metallization layer at one end and to contacts of the array of contacts at the other end to shield the active circuit area from interference through the sides of the silicon substrate;
    metal layers and dielectric layers over the active circuit area and the front side contacts, the metal layers being separated from each other by the dielectric layers; and
    a plurality of connecting vias to connect corresponding ones of the through silicon vias through the metal and dielectric layers, wherein the plurality of connecting vias and the corresponding ones of the through silicon vias form a plurality of side vias, and wherein the plurality of side vias completely surround the perimeter of the active circuit area of the silicon substrate from a plan view perspective.

2. The apparatus of claim 1, further comprising:
    a solder ball array over an outer dielectric layer, wherein the plurality of side vias are connected to the solder ball array.

3. The apparatus of claim 2, further comprising a substrate, wherein the substrate is a printed circuit board (PCB) and wherein the solder ball array is attached to the PCB by surface mount technology.

4. The apparatus of claim 2, wherein the side vias are spaced from each other at a distance smaller than an anticipated wavelength of electromagnetic interference.

5. The apparatus of claim 2, wherein the side vias are outside the active circuit area to shield the active circuit area from outside electromagnetic interference.

6. The apparatus of claim 1, wherein the metallization layer is a plated copper layer.

7. The apparatus of claim 1, wherein the silicon substrate is thinned before the metallization layer is applied.

8. The apparatus of claim 1, wherein the through-silicon vias are etched through the silicon substrate and filled with copper.

9. The apparatus of claim 1, further comprising:
    a silicon die over the silicon substrate, the silicon die to attach to the back side of the silicon substrate; and
    a second metallization layer over the silicon die, the second metallization layer being coupled to the metallization layer.

10. The apparatus of claim 9, wherein the silicon die is mounted within an opening in the metallization layer.

11. The apparatus of claim 10, wherein the silicon die has metal layers on sides of the silicon die electrically coupled to the second metallization layer and to the metallization layer and wherein the second metallization layer is coupled to the metallization layer through the side metal layers.

12. A computing system comprising:
    a printed circuit board;
    a memory attached to the printed circuit board; and
    a package attached to the printed circuit board, the package having a silicon substrate having a front side and a back side, the front side including active circuit area and an array of contacts to attach to a substrate, and the active circuit area having a perimeter, a metallization layer over the back side of the silicon substrate to shield the active circuit area from interference through the back side, and a plurality of through-silicon vias coupled to the metallization layer at one end and to contacts of the array of contacts at the other end to shield the active circuit area from interference through the sides of the silicon substrate, metal layers and dielectric layers over the active circuit area and the front side contacts, the metal layers being separated from each other by the dielectric layers, and a plurality of connecting vias to connect corresponding ones of the through silicon vias through the metal and dielectric layers, wherein the plurality of connecting vias and the corresponding ones of the through silicon vias form a plurality of side vias, and wherein the plurality of side vias completely surround the perimeter of the active circuit area of the silicon substrate from a plan view perspective.

13. The computing system of claim 12, wherein the printed circuit board comprises a ground plane and wherein the metallization layer is coupled to the ground plane through the through-silicon via.

14. The computing system of claim 12, wherein the through-silicon vias are spaced apart to form a Faraday cage around the active circuit area.

* * * * *